United States Patent
Abe et al.

(10) Patent No.: US 7,901,966 B2
(45) Date of Patent: Mar. 8, 2011

(54) METHOD FOR MANUFACTURING NITRIDE SEMICONDUCTOR DEVICE

(75) Inventors: Shinji Abe, Tokyo (JP); Kazushige Kawasaki, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 98 days.

(21) Appl. No.: 12/534,925

(22) Filed: Aug. 4, 2009

(65) Prior Publication Data

US 2010/0151658 A1 Jun. 17, 2010

(30) Foreign Application Priority Data

Dec. 17, 2008 (JP) ................... 2008-320386

(51) Int. Cl.
*H01L 21/00* (2006.01)
(52) U.S. Cl. ............. 438/31; 257/E21.097; 257/98; 117/915
(58) Field of Classification Search ............ 438/457, 438/459, 471, 143, 31; 257/98, E21.097; 117/915
See application file for complete search history.

(56) References Cited

U.S. PATENT DOCUMENTS

| 5,693,180 A | 12/1997 | Furukawa et al. |
| 2008/0293176 A1 | 11/2008 | Oka et al. |

FOREIGN PATENT DOCUMENTS

| JP | 5-285935 A | 11/1993 |
| JP | 8-293489 A | 11/1996 |
| JP | 2001-250805 A | 9/2001 |
| JP | 2002-270676 A | 9/2002 |
| JP | 2005-353229 A | 12/2005 |
| JP | 2008-251683 A | 10/2008 |

*Primary Examiner* — Matthew C Landau
*Assistant Examiner* — Sonya D McCall Shepard
(74) *Attorney, Agent, or Firm* — Leydig, Voit & Mayer, Ltd.

(57) ABSTRACT

A method for manufacturing a nitride semiconductor device, comprises: epitaxially growing a semiconductor layer of a GaN-based material on the Ga surface of a GaN substrate while the GaN substrate is mounted on a substrate holder the substrate warping during the epitaxial growth so that a epitaxial deposit is deposited on the N surface of the substrate; and subjecting the N surface of the GaN substrate to vacuum suction after the epitaxial growth of the semiconductor layer; removing the epitaxial deposit from the N side of the GaN substrate after the semiconductor layer has been epitaxially grown, and before the N surface of the n-type GaN substrate is subjected to vacuum suction.

8 Claims, 9 Drawing Sheets

US 7,901,966 B2

METHOD FOR MANUFACTURING NITRIDE SEMICONDUCTOR DEVICE

BACKGROUND OF THE INVENTION

1. Field of the Invention

The present invention relates to a method for manufacturing a nitride semiconductor device manufactured by the epitaxial growth of a semiconductor layer formed of a GaN-based material on the Ga surface of a GaN substrate in a state wherein the GaN substrate is mounted on a substrate holder, and the vacuum suction of the N surface of the GaN substrate with a vacuum suction apparatus. More specifically, the present invention relates to a method for manufacturing a nitride semiconductor device that can prevent the cracking of the GaN substrate during the vacuum suction.

2. Background Art

GaN-based materials have been attracting attention as the materials for a blue light-emitting element (for example, refer to Japanese Patent Laid-Open No. 2008-251683). A semiconductor layer formed of a GaN-based material is epitaxially grown on the Ga surface of a GaN substrate in a state wherein the GaN substrate is mounted on a substrate holder. Thereafter, the N surface of the GaN substrate must be subjected to vacuum suction with a vacuum suction apparatus for the delivery and transfer processes of the wafer.

SUMMARY OF THE INVENTION

A GaN substrate is originally warped so that the center of the Ga surface dents. When a semiconductor layer is epitaxially grown on the GaN substrate, the warpage quantity is increased by the stress of the semiconductor layer as the semiconductor layer is thickened. For example, in the case of a wafer having a diameter of 50 mm, difference in height between the center portion and the peripheral portion becomes as much as 40 μm. Therefore, the material gas of the semiconductor layer goes around the N surface of the GaN substrate, and a deposit containing the component of the material gas (hereafter referred to as "epitaxial deposit") is deposited. The epitaxial deposit caused a problem of the cracking of the GaN substrate when the N surface of the GaN substrate is subjected to vacuum suction with the vacuum suction apparatus.

Since GaN is a wide-gap semiconductor, GaN transmits light having a long wavelength, such as g line (wavelength: 436 nm) used in transcription processes, such as the formation of a ridge and the patterning of an electrode. Therefore, if an epitaxial deposit is present on the N surface of a GaN substrate, a problem, wherein diffused reflection was generated and the transcription process became unstable, was caused.

To solve such problems, it is an object of the present invention to provide a method for manufacturing a nitride semiconductor device that can prevent the cracking of the GaN substrate during the vacuum suction.

According to one aspect of the present invention, a method for manufacturing a nitride semiconductor device, comprises the steps of: epitaxially growing a semiconductor layer formed of a GaN-based material on the Ga surface of a GaN substrate in a state wherein the GaN substrate is mounted on a substrate holder; and subjecting the N surface of the GaN substrate to vacuum suction with a vacuum suction apparatus after the epitaxial growth of the semiconductor layer; removing an epitaxial deposit after the semiconductor layer has been epitaxially grown, and before the N surface of the n-type GaN substrate is subjected to vacuum suction; wherein when the semiconductor layer is epitaxially grown, the GaN substrate is warped so that the center of the Ga surface dents, material gas of the semiconductor layer goes around the N surface of the GaN substrate, and the epitaxial deposit is deposited on the N surface of the GaN substrate.

According to the present invention, the cracking of the GaN substrate during the vacuum suction can be prevented.

Other and further objects, features and advantages of the invention will appear more fully from the following description.

DETAILED DESCRIPTION OF THE PREFERRED EMBODIMENTS

First Embodiment

Figure 1:
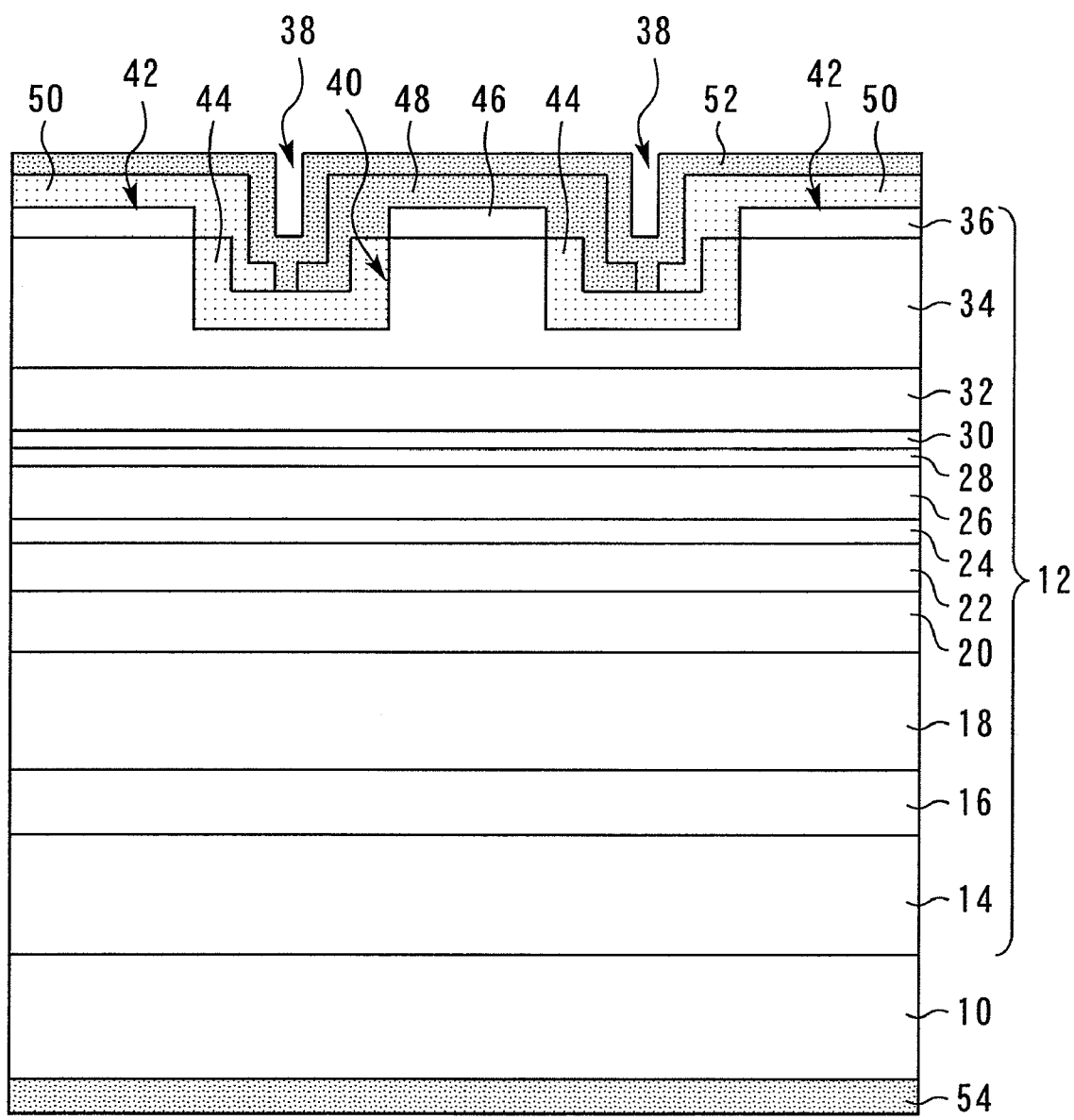
FIG. 1 is a sectional view showing a nitride semiconductor device according to the first embodiment of the present invention.

FIG. 1 is a sectional view showing a nitride semiconductor device according to the first embodiment of the present invention. The nitride semiconductor device is a blue-violet laser diode of a waveguide ridge type.

On the Ga surface of an n-type GaN substrate 10, as a semiconductor layer 12 formed of GaN-based materials, an n-type GaN buffer layer 14 having a thickness of 1 μm, an n-type $Al_{0.07}Ga_{0.93}N$ clad layer 16 having a thickness of 400 nm, an n-type $Al_{0.045}Ga_{0.955}N$ clad layer 18 having a thickness of 1000 nm, an n-type $Al_{0.015}Ga_{0.985}N$ clad layer 20 having a thickness of 300 nm, an n-type GaN light guiding layer 22 having a thickness of 80 nm, an n-side SCH (Separate Confinement Hetero structure) layer 24 formed of $In_{0.02}Ga_{0.98}N$ having a thickness of 30 nm, an active layer 26, a p-side SCH layer 28 formed of $In_{0.02}Ga_{0.98}N$ having a thickness of 30 nm, a p-type $Al_{0.2}Ga_{0.8}N$ electron barrier layer 30 having a thickness of 20 nm, a p-type GaN light guiding layer 32 having a thickness of 100 nm, a p-type $Al_{0.07}Ga_{0.93}N$ clad layer 34 having a thickness of 500 nm, and a p-type GaN contact layer 36 having a thickness of 20 nm are sequentially laminated. Si is doped as an n-type impurity, and Mg is doped as a p-type impurity.

The active layer 26 has a double quantum well structure wherein an $In_{0.12}Ga_{0.88}N$ well layer having a thickness of 5 nm, an $In_{0.02}Ga_{0.98}N$ barrier layer having a thickness of 8 nm, and an $In_{0.12}Ga_{0.88}N$ well layer having a thickness of 5 nm are sequentially laminated.

Since channels 38, which are recesses, are formed in the p-type GaN contact layer 36 and the p-type $Al_{0.07}Ga_{0.93}N$ clad layer 34, a waveguide ridge 40 is formed by a part of the p-type GaN contact layer 36 and a part of the p-type $Al_{0.07}Ga_{0.93}N$ clad layer 34. The width of each channel 38 is 10 µm. The table-like portions formed on the both outsides of the waveguide ridge 40 through the channel 38 are electrode pad bases 42.

A waveguide ridge 40 is placed in the central portion in the width direction of the cleaved end face that becomes the resonator end face of the laser diode, and extends between both cleaved end faces that become the end face of the resonator. The dimension of the waveguide ridge 40 in the lengthwise direction, i.e. the resonator length is 1000 µm. The ridge width in the direction perpendicular to the lengthwise direction of the waveguide ridge 40 is one to several tens of micrometers, for example, 1.5 µm. The height of the waveguide ridge 40 from the bottom face of the channel 38 is 0.5 µm.

The both sides of the channel 38 including the sidewall of the waveguide ridge 40 and the sidewall of the electrode pad base 42 and the bottom surface of the channel 38 are coated by $SiO_2$ films 44 having a thickness of 200 nm. The height of the upper end of the $SiO_2$ films 44 coating the both sides of the channel 38 is about the same height of the lower surface of the p-type GaN contact layer 36. The $SiO_2$ film 44 is not formed on the upper surface of the p-type GaN contact layer 36 of the waveguide ridge 40. By the opening 46 of the $SiO_2$ film 44, the entire upper surface of the p-type GaN contact layer 36 and the both sides of the p-type GaN contact layer 36 are exposed. A film formed of $SiO_x$ (0<x<2), SiN, SiON, $TiO_2$, $Ta_2O_5$, $Al_2O_3$, AlN, $ZrO_2$, $Nb_2O_5$, MgO, SiC, or the like may also be used in place of the $SiO_2$ film 44.

A p-side electrode 48 contacting and electrically connected to the p-type GaN contact layer 36 is formed on the upper surface of the p-type GaN contact layer 36. The p-side electrode 48 is composed of a Pd single layer, a Pd/Ta laminate structure, or a Pd/Ta/Pd laminate structure. The p-side electrode 48 closely contacts the upper surface and the both sides of the p-type GaN contact layer 36, further coats the upper end of the $SiO_2$ film 44 from the p-type GaN contact layer 36, and extends onto a part of the $SiO_2$ film 44 on the bottom of the channel 38 via the $SiO_2$ film 44 on the sidewall of the waveguide ridge 40.

A $SiO_2$ film 50 is formed on the upper surface of the electrode pad base 42, and on the surface of the $SiO_2$ film 44 on the sides of the electrode pad base 42 in the channel 38 and the surface of a part of the $SiO_2$ film 44 on the bottoms of the channels 38. The $SiO_2$ film 50 may be substituted by a film composed of SiOx (0<x<2), SiN, SiON, $TiO_2$, $Ta_2O_5$, $Al_2O_3$, AlN, $ZrO_2$, $Nb_2O_5$, or the like.

A pad electrode 52 is formed on the surface of the p-side electrode 48 in the close contact with the p-side electrode 48. The pad electrode 52 is placed on the p-side electrode 48, the $SiO_2$ film 44, and the $SiO_2$ film 50 inside the channels 38 on the both sides of the waveguide ridge 40, and further extends onto the $SiO_2$ film 50 placed on the upper surface of the electrode pad base 42. On the back face of the n-type GaN substrate 10, an n-side electrode 54, wherein Ti, Pt, and Au films are sequentially laminated by a vacuum evaporation method, is provided.

A method for manufacturing a nitride semiconductor device according to the first embodiment of the present invention will be described referring to the drawings.

Figure 2:
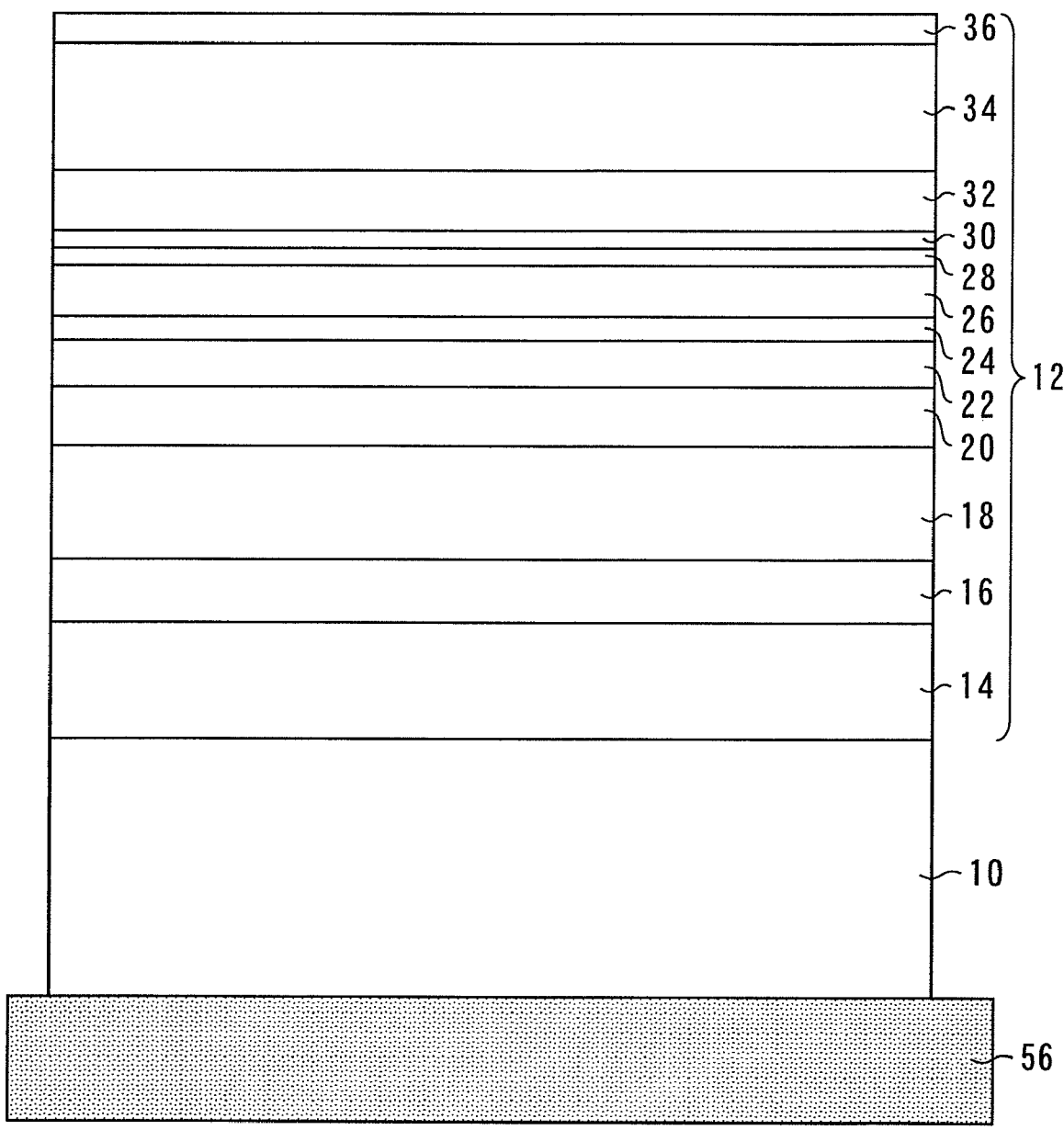
FIGS. 2-17 are sectional views for explaining a method of manufacturing a nitride semiconductor device according to the first embodiment of the present invention.

First, as shown in FIG. 2, an n-type GaN substrate 10 whose surface has been previously cleaned by thermal cleaning or the like is mounted on a substrate holder 56. In this state, on the Ga surface of the n-type GaN substrate 10, as a semiconductor layer 12 formed of a GaN-based material, an n-type GaN buffer layer 14, an n-type $Al_{0.07}Ga_{0.93}N$ clad layer 16, an n-type $Al_{0.045}Ga_{0.955}N$ clad layer 18, an n-type $Al_{0.015}Ga_{0.985}N$ clad layer 20, an n-type GaN light guiding layer 22, an n-side SCH layer 24 formed of $In_{0.02}Ga_{0.98}N$, an active layer 26, a p-side SCH layer 28 formed of $In_{0.02}Ga_{0.98}N$, a p-type $Al_{0.2}Ga_{0.08}N$ electron barrier layer 30, a p-type GaN light guiding layer 32, a p-type $Al_{0.07}Ga_{0.93}N$ clad layer 34, and a p-type GaN contact layer 36 are epitaxially grown by MOCVD. The growing temperature is, for example, 1000° C.

Figure 3:
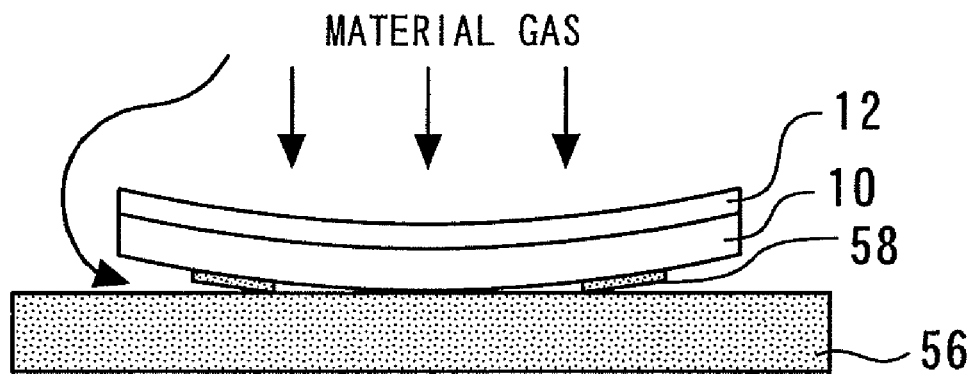

Here, the GaN substrate 10 is originally warped so that the center of the Ga surface dents. As the grown semiconductor layer 12 is thickened, the warpage quantity is increased by the stress of the semiconductor layer 12. Particularly, when the semiconductor layer 12 contains AlGaN, the warpage quantity is large. Thereby, as shown in FIG. 3, the state wherein the center of the N surface of the n-type GaN substrate 10 contacts the substrate holder 56 and the peripheral portion is floating from the substrate holder 56, is formed. Therefore, the material gas of the semiconductor layer 12 runs around the N surface of the n-type GaN substrate 10, and an epitaxial deposit 58 having a thickness of 5 to 6 µm is stacked on the N surface of the n-type GaN substrate 10.

Figure 4:
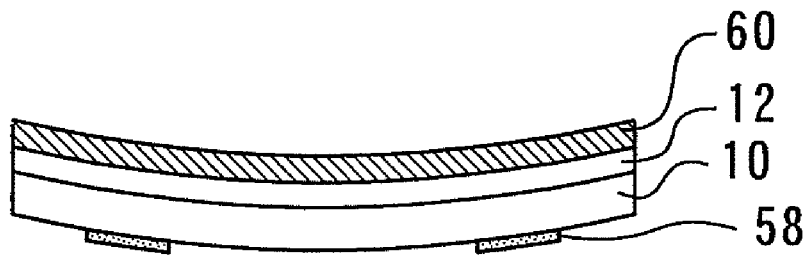

Next, as shown in FIG. 4, the semiconductor layer 12 is coated with a protective film 60. As the protective film 60, a material that can be removed by wet etching, such as an insulating film, metal, resist, or wax, is used. Specifically, $SiO_2$, SiN, $Al_2O_3$, SiON, or the like is used as the material for the insulating film; Au, Cr, Ti, or the like is used as the metal: Sky Coat BRT-55 or Sky Coat BD-357 is used as the wax. As the resist, a positive resist, such as MCPR 2200X or MCPR 4200XM, an image reverse resist such as AZ5214E or a negative resist, such as OMR-83-60cP and OMR-83-150cP, is used. When an organic material, such as wax and resist, is used, the material is dissolved in a solvent, such as toluene; and after the solution is applied onto the wafer using a spin coater, the solvent is evaporated by baking; thereby forming the protective film 60. Here, the spin coater is a machine for coating wafers by injecting or dropping the resist or the like from a nozzle while rotating the wafers.

Figure 5:
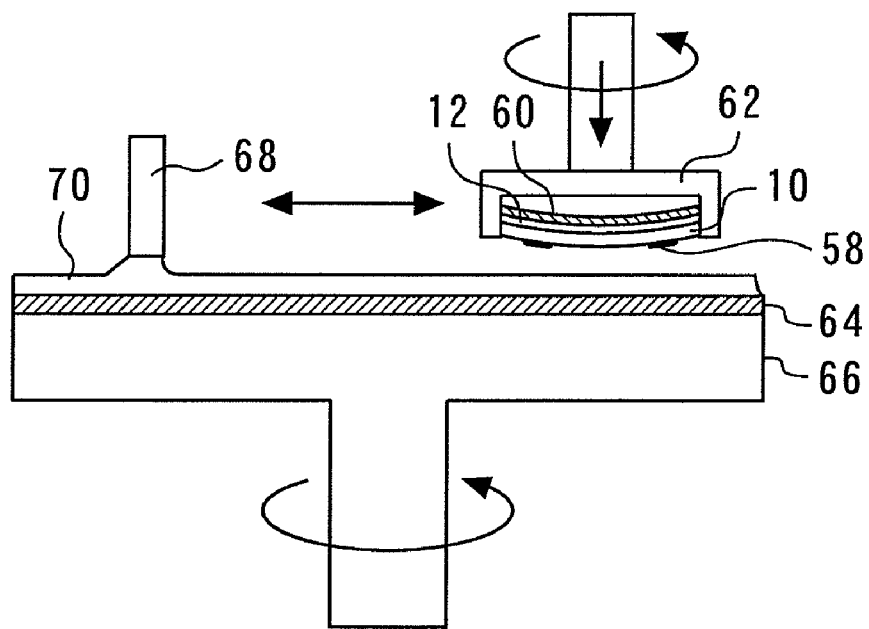

Next, as shown in FIG. 5, the n-type GaN substrate 10 is held by the wafer carrier 62 with the N surface facing down. Then, the polishing table 66 on which an abrasive pad 64 is adhered is rotated around the center shaft. Furthermore, while flowing an abrasive compound 70 on the abrasive pad 64 from a nozzle 68, the wafer carrier 62 is rotated and reciprocally moved while pressing the N surface of the n-type GaN substrate 10 against the abrasive pad 64. By thus polishing the N surface of the n-type GaN substrate 10, the epitaxial deposit 58 is removed. The epitaxial deposit 58 may be removed by grinding. Thereafter, the protective film 60 is removed by wet etching. As the etchant at this time, a hydrocarbon based solution or an aromatic based solution is used when the protective film 60 is a wax, and an organic solvent is used when the protective film 60 is a resist.

Figure 6:
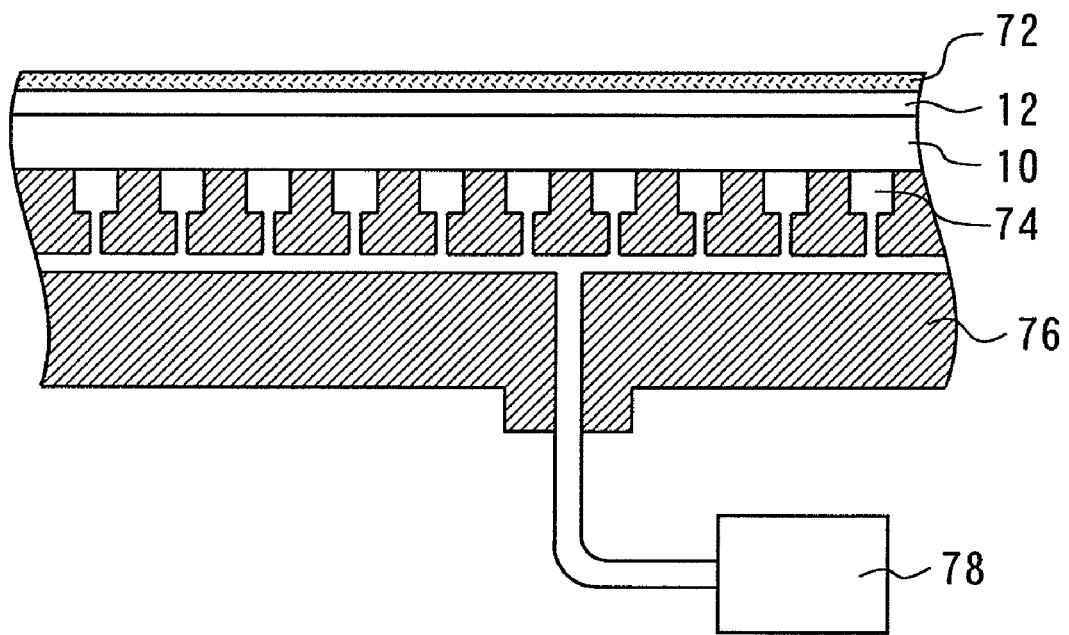

Next, a resist 72 is applied onto the entire surface of the semiconductor layer 12 by spin coating. Then, as shown in FIG. 6, by closely contacting the attracting surface of a vacuum suction machine 76 wherein a plurality of suction ports 74 are formed with the N surface of the n-type GaN substrate 10, and exhausting the air through the suction ports 74 using a vacuum pump 78, the N surface of the n-type GaN substrate 10 is subjected to vacuum suction using the vacuum suction machine 76. In this state, the wafer is transferred into transcription equipment.

Figure 7:
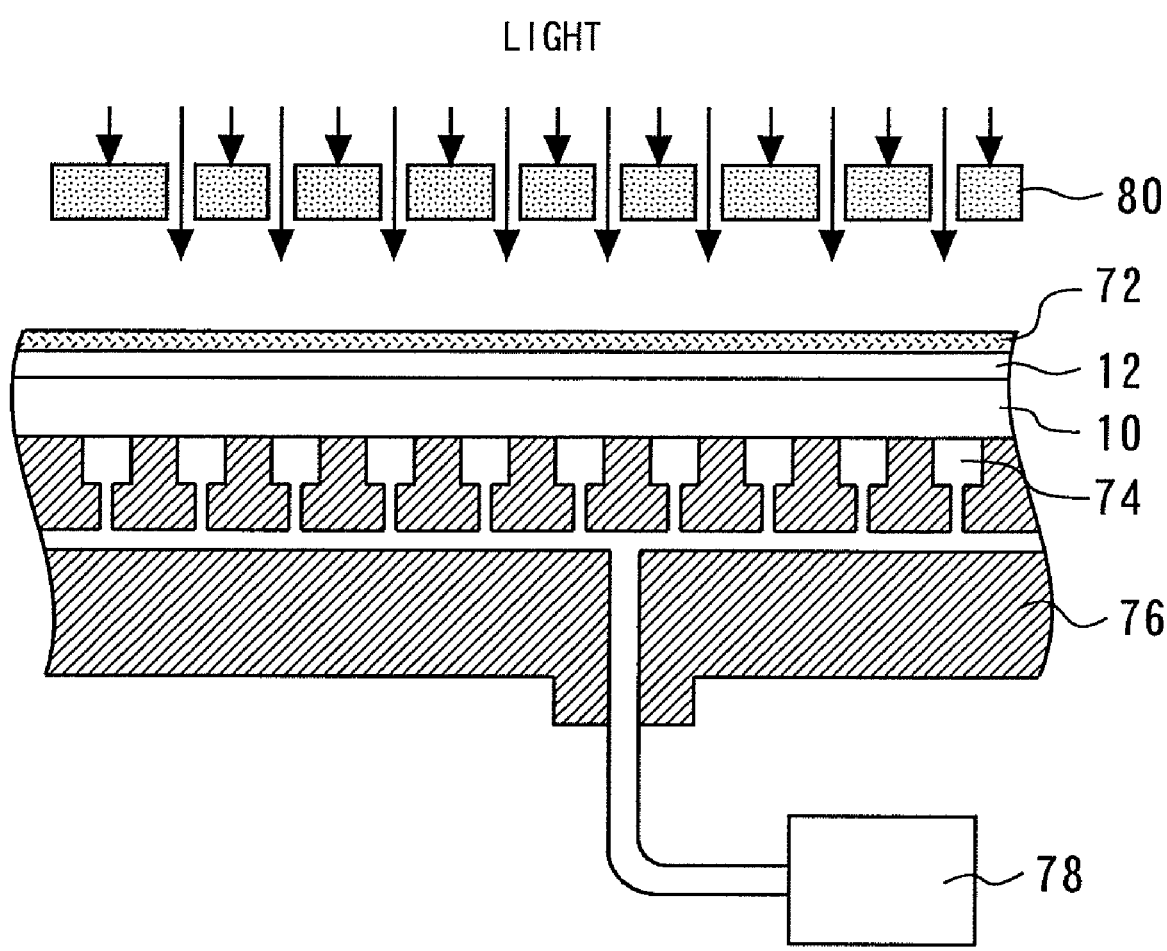
Figure 8:
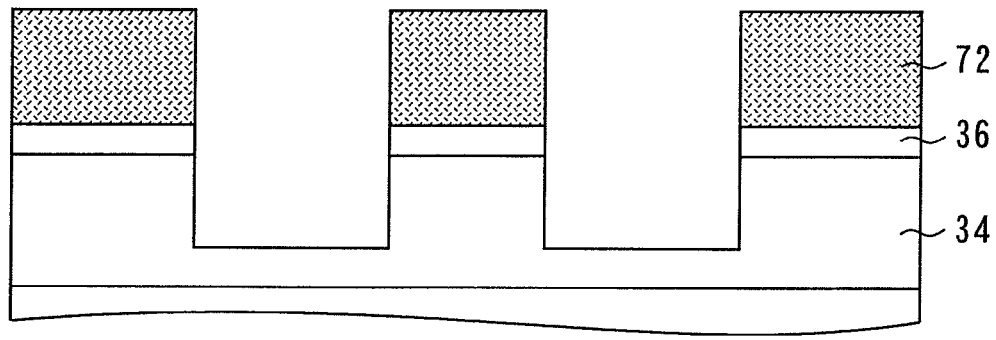

Next, as shown in FIG. 7, in the state where the N surface of the n-type GaN substrate 10 is subjected to vacuum suction, the resist 72 is irradiated with light of the g line or the like via a mask 80 to expose the resist 72 (transcription process). Then, by conducting a developing process, as shown in FIG.

8, the resist 72 on the area corresponding to the shape of channels 38 is removed, leaving the resist 72 on the area corresponding to the shape of the waveguide ridge 40.

Figure 9:
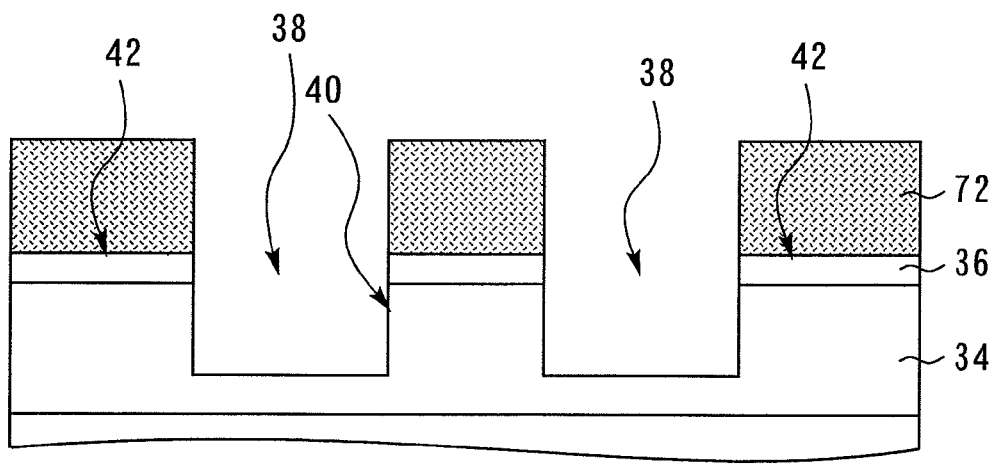

Next, as shown in FIG. 9, parts of the p-type GaN contact layer 36 and the p-type $Al_{0.07}Ga_{0.93}N$ clad layer 34 are evenly etched from the surface of the p-type GaN contact layer 36 by, for example, RIE (reactive ion etching) using the resist 72 as a mask to form channels 38. The etching depth is 500 nm. By forming channels 38, the waveguide ridge 40 and electrode pad bases 42 are also formed.

Figure 10:
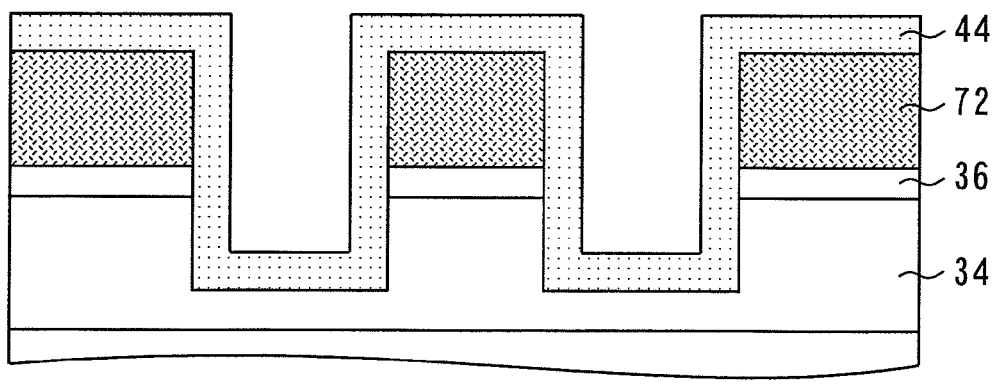

Next, as shown in FIG. 10, a $SiO_2$ film 44 is formed on the entire surface of the n-type GaN substrate 10 by CVD, sputtering, or the like leaving the resist 72. The $SiO_2$ film 44 coats the upper surface and the sides of the resist 72 left on the apex of the waveguide ridge 40 and on the electrode pad base 42, and the bottom surface and surface inside the sides of the channels 38.

Figure 11:
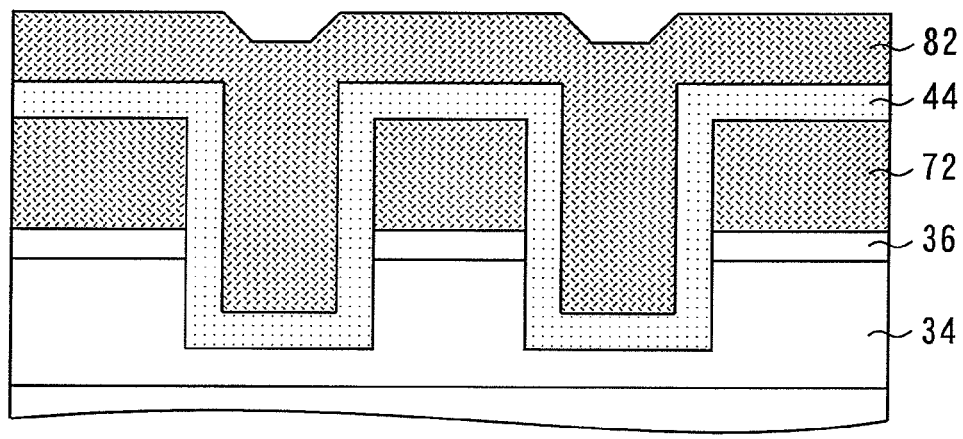

Next, as shown in FIG. 11, a resist is applied onto the entire surface of the n-type GaN substrate 10 by spin coating to form a resist 82 so that the layer thickness in the channels 38 is thicker (0.8 μm) than the layer thickness on the apex of the waveguide ridge 40 and the apex of the electrode pad base 42 (0.4 μm). Specifically, the layer thickness is made to be uniform by dropping the resist 82 on the substrate and rotating the wafer. The layer thickness of the resist 82 is controlled by adequately selecting the viscosity and dropping quantity of the resist 82 and the rotation speed and rotation time of the wafer.

Figure 12:
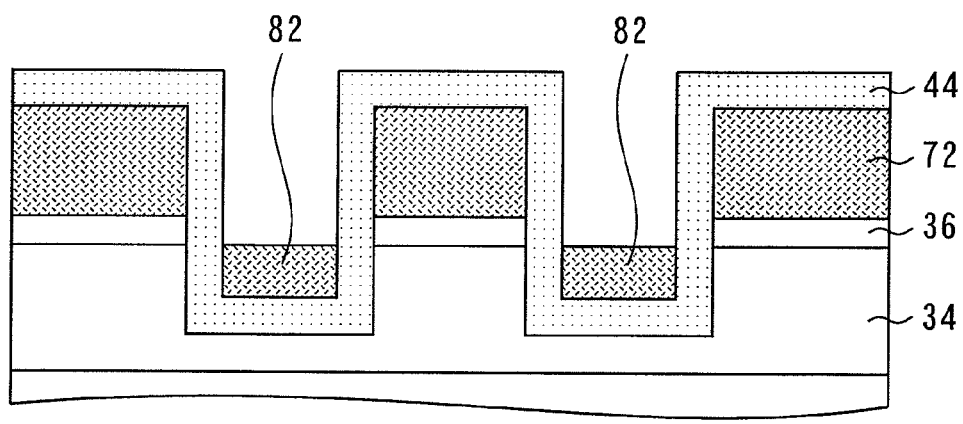

Next, as shown in FIG. 12, the resist 82 is etched back by dry etching using $O_2$ plasma, and the resist 82 on the apex of the waveguide ridge 40 and the apex of the electrode pad base 42 is completely removed. Here, the height of the surface of the resist 82 is made to be the same degree of height as the lower surface of the p-type GaN contact layer 36. Thereby, the $SiO_2$ film 44 coating the upper surface and the sides of the resist 72, and the sides of the p-type GaN contact layer 36 is completely exposed.

Figure 13:
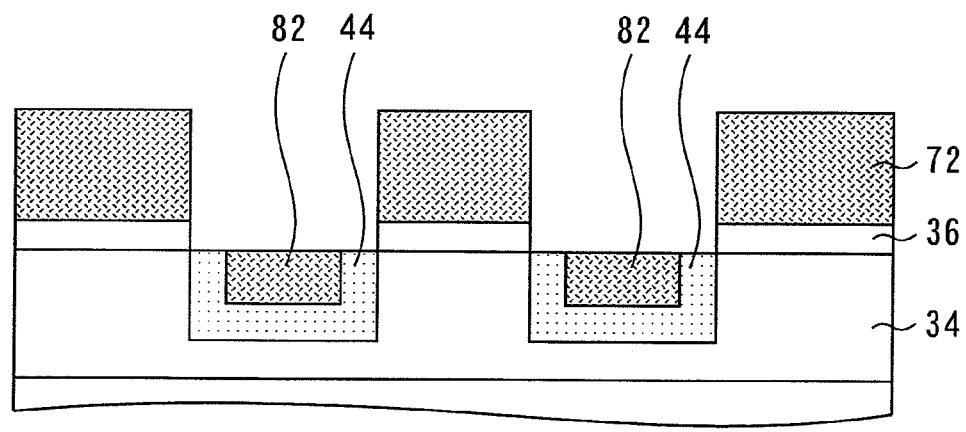

Next, as shown in FIG. 13, using the resist 82 as a mask, the exposed $SiO_2$ film 44 is removed by dry etching using $CF_4$, or wet etching using buffered hydrofluoric acid or the like. Specifically, leaving the $SiO_2$ film 44 on the sides and the bottom of the channel 38 coated by the resist 82, the $SiO_2$ film 44 placed on the upper surface and the sides of the resist 72 placed on the apex of the waveguide ridge 40 and the apex of the electrode pad base 42, and placed on the sides of the p-type GaN contact layer 36 is completely removed to completely expose the resist 72 placed on the apex of the waveguide ridge 40 and the apex of the electrode pad base 42. Here, the sides of the p-type GaN contact layer 36 are also exposed, and openings 46 are formed in the $SiO_2$ film 44.

Figure 14:
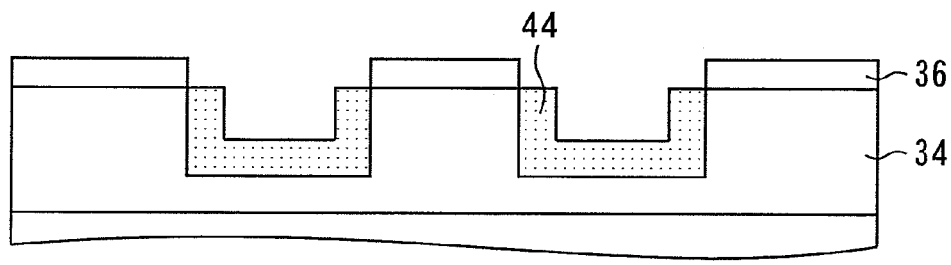

Next, as shown in FIG. 14, the resist 72 and the resist 82 are removed by wet etching using an organic solvent, ashing using $O_2$, or wet etching using a mixed solution of sulfuric acid and hydrogen peroxide.

Figure 15:
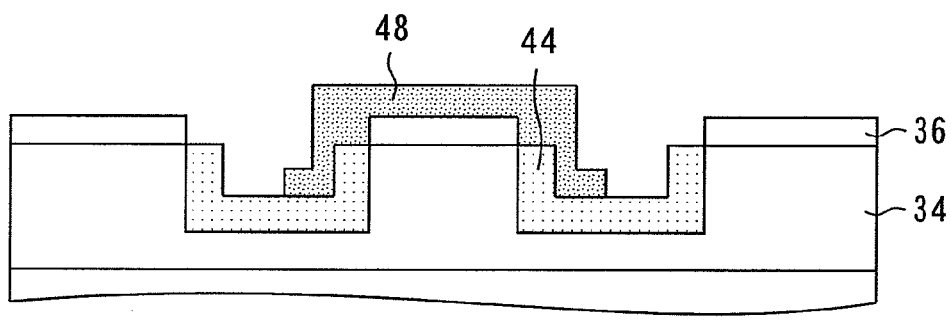

Next, a resist is applied onto the entire surface of the wafer, and the resist is exposed in the state where the N surface of the n-type GaN substrate 10 is subjected to vacuum suction. Then, a developing is performed to form a resist (not shown) having openings to expose portions of the upper surface of the p-type GaN contact layer 36, which is the uppermost layer of the waveguide ridge 40, the sidewall of the waveguide ridge 40, and the bottoms of the channels 38. On the resist, an electrode layer composed of a Pd single layer, a Pd/Ta laminate structure, or a Pd/Ta/Pd laminate structure is formed by vacuum vapor deposition. Thereafter, the resist and the electrode layer formed on the resist are removed using a liftoff method to form a p-side electrode 48 on the apex of the waveguide ridge 40 as shown in FIG. 15.

Figure 16:
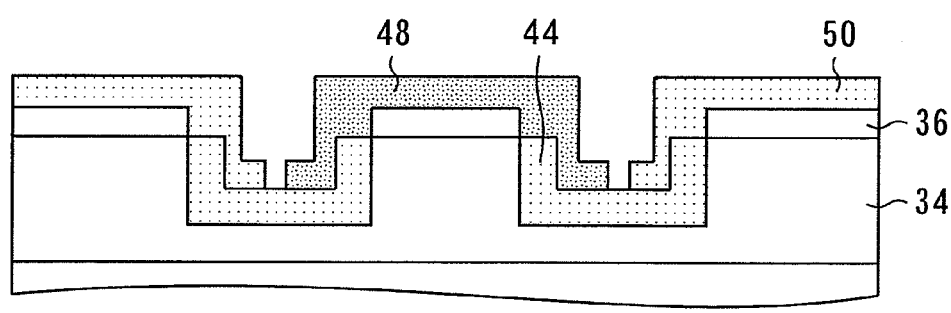

Next, a resist is applied onto the entire surface of the wafer, and the resist is exposed in a state where the N surface of the n-type GaN substrate 10 is subjected to vacuum suction. Then, a developing is performed to form a resist (not shown) having openings to expose portions other than on the p-side electrode 48, i.e. the upper surface of the electrode pad base 42, and portions of the sides of the electrode pad base 42 in the channel 38 and the bottom of the channel 38. A $SiO_2$ film having a thickness of 100 nm is formed on the entire surface of the wafer by vapor deposition. The resist formed on the p-side electrode 48, and the $SiO_2$ film formed on the resist are removed using a liftoff method. Thereby, a $SiO_2$ film 50 is formed as shown in FIG. 16.

Figure 17:
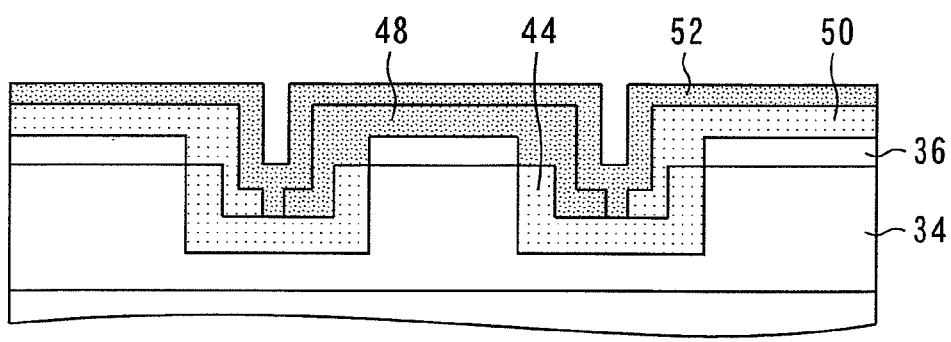

Next, as shown in FIG. 17, a Ti/Ta/Ti/Au laminate structure or a Ti/Mo/Ti/Au laminate structure is formed on the p-side electrode 48, the channel 38, and the $SiO_2$ film 50 using vacuum vapor deposition to form a pad electrode 52.

Next, the back face of the n-type GaN substrate 10 is ground to reduce the thickness of the n-type GaN substrate 10 from 400 μm to 100 μm. Then, an n-side electrode 54 is formed on the back face of the n-type GaN substrate 10. Thereafter, the n-type GaN substrate 10 is cleaved to form chips. Through the steps described above, the nitride semiconductor device according to the first embodiment can be manufactured.

As described above, in the first embodiment, after the semiconductor layer 12 has been epitaxially grown, and before the N surface of the n-type GaN substrate 10 is subjected to vacuum suction, the epitaxial deposit 58 is removed. Thereby, the cracking of the n-type GaN substrate 10 due to vacuum suction can be prevented.

By removing the epitaxial deposit 58 on the N surface of the n-type GaN substrate 10 before carrying out the transcription process, diffused reflection can be prevented, and a stable transcription process can be carried out.

When the epitaxial deposit 58 is removed by abrading or grinding, the n-type GaN substrate 10 is also abraded. However, no problems are caused because the n-type GaN substrate 10 is thinned by back abrading in the following step.

By coating the semiconductor layer 12 with the protective film 60 before the step to remove the epitaxial deposit 58, the damage of the semiconductor layer 12 or the adhesion of contaminants to the semiconductor layer 12 in the step to remove the epitaxial deposit 58 can be prevented. If the protective film 60 is removed by dry etching, the semiconductor layer 12 is also etched; and therefore, wet etching should be used for removing the protective film 60.

Second Embodiment

Figure 18:
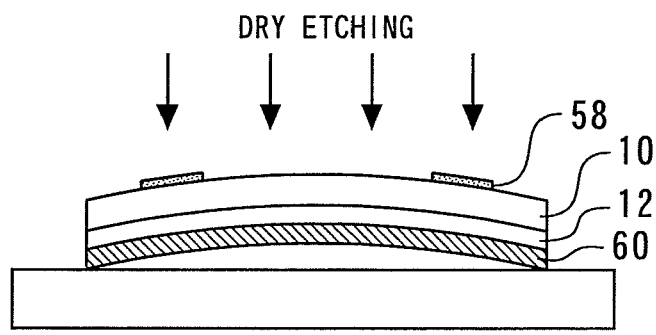
FIG. 18 is a sectional view for explaining a method of manufacturing a nitride semiconductor device according to the second embodiment of the present invention.

In the second embodiment, as shown in FIG. 18, the epitaxial deposit 58 is removed by the dry etching of the N surface of the n-type GaN substrate 10 using an etching gas such as $SiCl_4$, $Cl_2$, and Ar. Otherwise, the second embodiment is identical to the first embodiment. Although the epitaxial deposit 58 formed of a GaN-based material is difficult to be removed by wet etching, it can be removed by dry etching. Therefore, an equivalent effect as in the first embodiment can be obtained.

Third Embodiment

Figure 19:
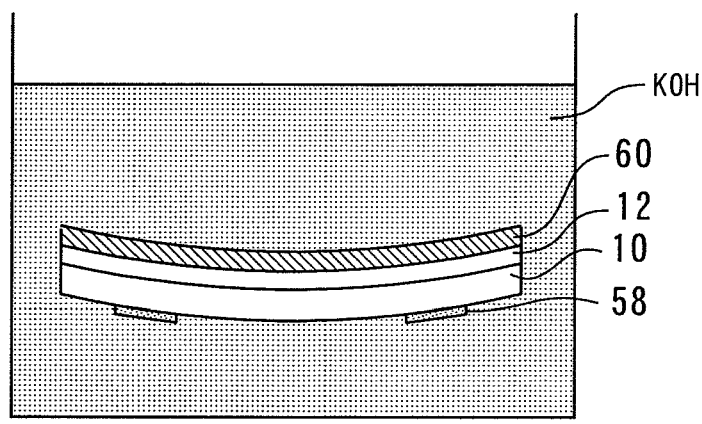
FIG. 19 is a sectional view for explaining a method of manufacturing a nitride semiconductor device according to the third embodiment of the present invention.

In the third embodiment, as shown in FIG. 19, the epitaxial deposit 58 is removed by selectively etching the N surface relative to the Ga surface of the n-type GaN substrate 10 using KOH. However, a material that is not dissolved in KOH, such as an insulating film and a metal film, is used as the protective film 60. Otherwise, the second embodiment is identical to the first embodiment.

KOH does not corrode the Ga surfaces of the n-type GaN substrate 10 and the semiconductor layer 12, and selectively etches the N surface of the n-type GaN substrate 10. Thereby, the epitaxial deposit 58 can be peeled in a liftoff manner. Therefore, an equivalent effect as in the first embodiment can be obtained.

Fourth Embodiment

Figure 20:
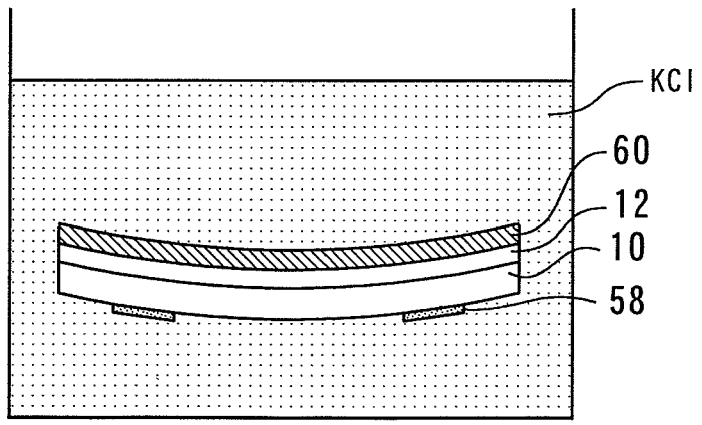
FIG. 20 is a sectional view for explaining a method of manufacturing a nitride semiconductor device according to the fourth embodiment of the present invention.

In the fourth embodiment, as shown in FIG. 20, the epitaxial deposit 58 is removed using HCl. Otherwise, the fourth embodiment is identical to the first embodiment. When the epitaxial deposit 58 is oxidized, it can be removed by HCl. Therefore, an equivalent effect as in the first embodiment can be obtained.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2008-320386, filed on Dec. 17, 2008 including specification, claims, drawings and summary, on which the Convention priority of the present application is based, are incorporated herein by reference in its entirety.

What is claimed is:

1. A method for manufacturing a nitride semiconductor device, comprising:
    epitaxially growing a semiconductor layer of a GaN-based material on the Ga surface of a GaN substrate while the GaN substrate is mounted on a substrate holder, the epitaxially grown semiconductor layer warping the GaN substrate so that a source gas for growing the semiconductor layer reaches and deposits an epitaxial deposit on the N surface of the GaN substrate;
    subjecting the N surface of the GaN substrate to vacuum suction after epitaxially growing the semiconductor layer; and
    removing the epitaxial deposit after epitaxially growing the semiconductor layer, and before subjecting the N surface of the GaN substrate to vacuum suction.

2. The method for manufacturing a nitride semiconductor device according to claim 1, further comprising:
    applying a resist to the semiconductor layer; and
    irradiating the resist with light while subjecting the N surface of the GaN substrate to vacuum suction.

3. The method for manufacturing a nitride semiconductor device according to claim 1, including removing the epitaxial deposit by abrading or grinding the N surface of the GaN substrate.

4. The method for manufacturing a nitride semiconductor device according to claim 1, including removing the epitaxial deposit by dry etching the N surface of the GaN substrate.

5. The method for manufacturing a nitride semiconductor device according to claim 1, including removing the epitaxial deposit by selectively etching the N surface, relative to the Ga surface, of the GaN substrate with KOH.

6. The method for manufacturing a nitride semiconductor device according to claim 1, including oxidizing the epitaxial deposit, and removing the epitaxial deposit by etching with HCl.

7. The method for manufacturing a nitride semiconductor device according to claim 1, further comprising:
    coating the semiconductor layer with a protective film before removing the epitaxial deposit; and
    removing the protective film by wet etching after removing the epitaxial deposit.

8. The method for manufacturing a nitride semiconductor device according to claim 1, wherein the semiconductor layer is AlGaN.

* * * * *